United States Patent

Sahashi et al.

[11] Patent Number: 5,260,615
[45] Date of Patent: Nov. 9, 1993

[54] MAGNETOELASTIC WAVE DEVICE

[75] Inventors: Masashi Sahashi; Tadahiko Kobayashi; Tetsuhiko Mizoguchi, all of Yokohama, Japan

[73] Assignee: Kabushiki Kaisha Toshiba, Kawasaki, Japan

[21] Appl. No.: 723,305

[22] Filed: Jun. 28, 1991

[30] Foreign Application Priority Data

Jun. 28, 1990 [JP] Japan ............... 2-168210

[51] Int. Cl.$^5$ ............................ H01L 41/08
[52] U.S. Cl. .................. 310/26; 310/313 A; 333/201
[58] Field of Search ............... 310/26, 313 R, 313 A, 310/313 D; 333/152, 201

[56] References Cited

U.S. PATENT DOCUMENTS

| 4,078,186 | 3/1978 | Folen et al. ............... 310/26 |
| 4,209,759 | 6/1980 | Volluet ..................... 310/26 |
| 4,308,474 | 12/1981 | Savage et al. ............. 310/26 |
| 4,318,061 | 3/1982 | Castera et al. ........... 310/313 R |
| 4,375,372 | 3/1983 | Koon et al. ............... 310/26 |
| 4,465,986 | 8/1984 | Loh et al. ................. 310/26 |
| 4,565,984 | 1/1986 | Castera et al. ............ 310/26 |

OTHER PUBLICATIONS

"Variable Frequency SAW Resonators on Ferroelectric-Ferroelastics," By L. Coldren et al., Appl. Phys. Lett. 32(3), Feb. 1, 1978.
IEEE Transactions On Magnetics, vol. mag-16, No. 5, Sep. 1980, pp. 916-918, M. Yamaguchi, et al.,: "Variable Saw Delay Line Using Amorphous TbFe$_2$ Film".
Applied Phys. Letters, vol. 31, No. 4; D. C. Webb, K. L. Davis, N. C. Koon, and A. K. Ganguly; Jun. 6, 1977.
J. Appl. Phys. 49(2); A. K. Ganguly, K. L. Davis, and D. C. Webb; Feb. 1978.

Primary Examiner—Mark O. Budd
Assistant Examiner—Thomas M. Dougherty
Attorney, Agent, or Firm—Oblon, Spivak, McClelland, Maier & Neustadt

[57] ABSTRACT

A magnetoelastic wave device comprising a substrate, a magnetostrictive film formed over the substrate, a wave generating section, a wave receiving section, and a modulation magnetic field generating section. The magnetostrictive film has an axis of easy magnetization which is substantially <uv0> axis and extends parallel to the major surfaces of the magnetostrictive film.

10 Claims, 4 Drawing Sheets

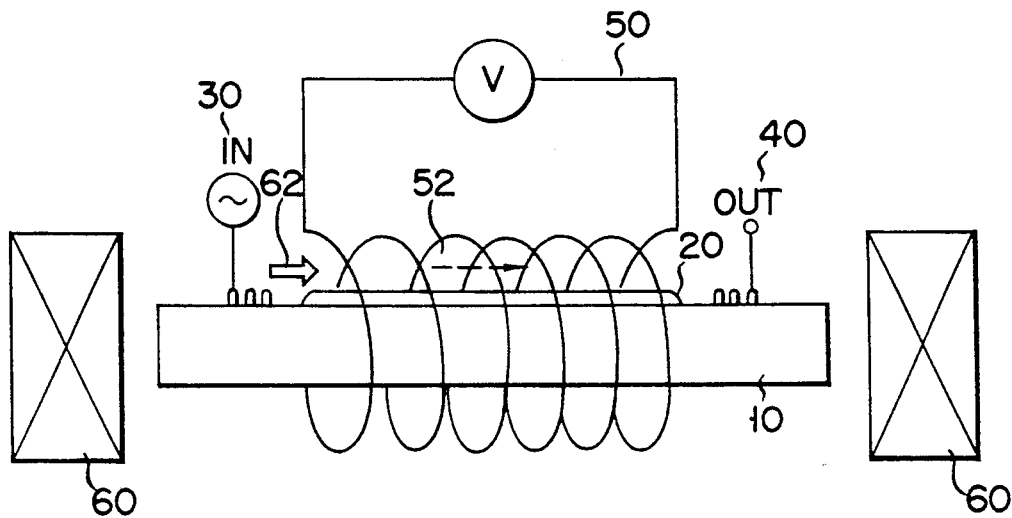
F I G. 1A
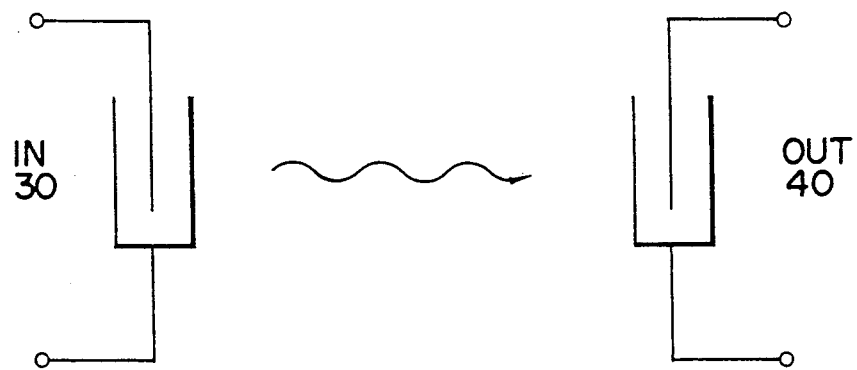
F I G. 1B

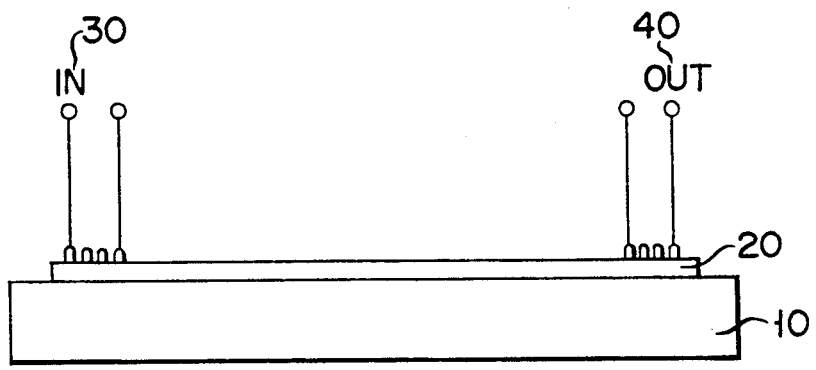
F I G. 2A
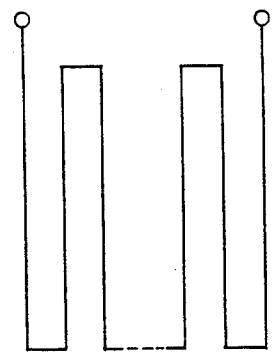
F I G. 2B

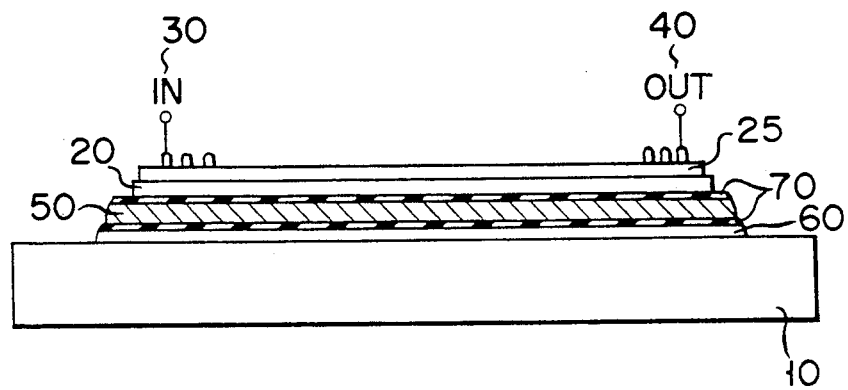
F I G. 3A
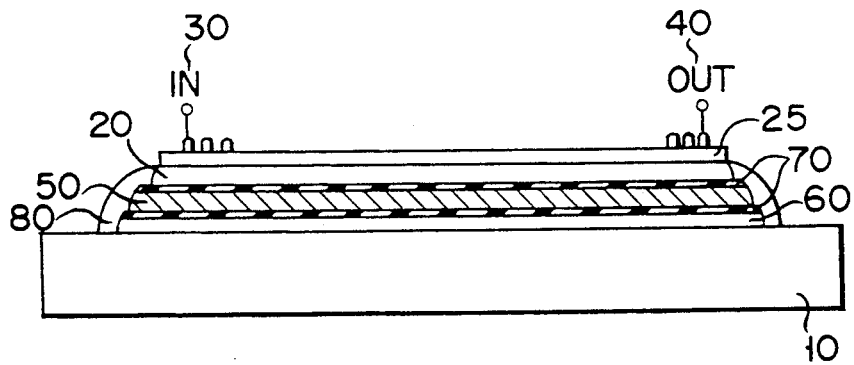
F I G. 3B

MAGNETOELASTIC WAVE DEVICE

BACKGROUND OF THE INVENTION

1. Field of the Invention

The present invention relates to a magnetoelastic wave device, such as a phase shifter, a variable delay circuit, a tuner, an oscillator or a filter, which utilizes bulk elastic waves or surface acoustic waves.

2. Description of the Related Art

Magnetoelastic wave devices utilizing the magnetostriction have been studied. These devices have their input-output characteristics changed to a desired value when a magnetic field is applied to them, thereby changing the speed of sound. Among these devices is the delay element disclosed in IEEE Trans. Mag., MAG-16 (1980), p. 916, which comprises an $LiNbO_3$ substrate and a $TbFe_2$ amorphous magnetostrictive alloy layer.

Each magnetoelastic wave device hitherto developed is not practical in two respects. First, the sound speed is changed by only 0.3% at most. Second, the propagation loss of energy (i.e., attenuation) is great.

Another type of a magnetoelastic wave device is disclosed in D. C. Webb, K. L. Davis, N. C. Koon, and A. K. Ganguly, *Magnetoelastic Surface Wave Propagation in a Low-anisotropy Rare-earth-iron Compound at 80 MHz*, Applied Physics Letters, Vol. 31, No. 4, Aug. 15, 1997, pp 245-247 and also in A. K. Ganguly, K. L. Davis, and D. C. Webb, *Magnetoelastic Surface Wave on the (110) Plane of Highly Magnetostrictive Cubic Crystal*, J. Appl. Phys., 49(2), February, 1978, pp. 759-767. Magnetoelastic wave devices of this type have not been put to practical use, since they fail to meet two requirements, i.e., (i) a high ratios of sound speed and (ii) small propagation loss.

As described above, the magnetoelastic wave devices hitherto developed, though seeming to have no practical value, can function as a tuner, provided that their input-output characteristics are changed by applying a magnetic field to them. As is known in the art, magnetoelastic wave devices are very small. Hence, it is desired that the magnetoelastic wave device, which functions as a tuner, be invented and incorporated in a system, so that the system may be reduced in size.

SUMMARY OF THE INVENTION

The object of the present invention is to provide a magnetoelastic wave device which can be driven with a low-intensity magnetic field and has a small propagation loss, and more particularly to a magnetoelastic wave device which is magnetostrictive and whose input-output characteristics can be changed.

According to the invention, there is provided a magnetoelastic wave device comprising a substrate, a magnetostrictive film formed over the substrate, a modulation magnetic field generating section for generating a modulation magnetic field, a wave generating section for generating a magnetoelastic wave to be applied to the magnetostrictive film, and a wave receiving section for receiving the magnetoelastic wave passing through the magnetostrictive film.

The device according to the invention is characterized in that the magnetostrictive film is either a single-crystal film or a polycrystalline orientated film, whose axis of easy magnetization is $<uv0>$ and extends parallel to its major surfaces.

The substrate of the device is made of glass, metal, magnetic material, piezoelectric material, magnetostrictive material, and the like. If the substrate needs to excite magnetoelastic waves, it must be either made of piezoelectric material (e.g., $LiNbO_3$, $ZnO$ and so on), or covered, with a film of piezoelectric material. Then, if the substrate is not piezoelectric material, the same effect can be derived by piezoelectric material formed over the magnetostrictive film which is formed over the substrate.

The magnetostrictive film is an orientated film made of single-crystal or polycrystalline material, has an axis of easy magnetization is $<uv0>$ such as axis $<100>$, where both "u" and "v" are not "0", and the axis of easy magnetization extends parallel to its major surfaces. The magnetostrictive film should better be made of material which has low magnetic anisotropy and formed of cubic crystals exhibiting good crystal symmetry.

Preferably, the $\lambda_{100}$, $\lambda_{110}$ and $\lambda_{111}$ crystals of this material have a magnetostriction ratio of 10 or less. The smaller the magnetostriction value of the film, the lower the efficiency of magnetic-field modulation. Hence, the film should better exhibit super magnetostriction, i.e., magnetostriction of $100 \times 10^{-6}$ or more. Magnetoelastic waves can propagate in any direction at an angle ranging from 0° to 90° to the axis of easy magnetization.

The magnetostrictive material is rare earth-iron based Laves-type compound, artificial lattice film made of rare earth element (or alloy thereof) and transient metal (or alloy thereof), or composite or multi-layered material formed of rare earth metal (or alloy thereof) and oxide, boride or nitride. In particular, rare earth-iron-cobalt alloys, identified by the following general formulas, is preferred:

1. Formula (in ratio of atomic weight)

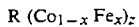

$$R(Co_{1-x}Fe_x)_z$$

where $0.001 \leq x \leq 0.8$ $$0.2 \leq z \leq 10$$

R: at least one element selected from the group consisting of Y, La, Ce, Pr, Nd, Sm, Gd, Dy, Er, Yb and Lu.

2. Formula (in ratio of atomic weight)

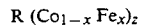

$$R(Co_{1-x}Fe_x)_z$$

where $0.001 \leq x \leq 0.8$ $$0.2 \leq z \leq 10$$

R: at least one element selected from the group consisting of Y and a rare-earth element.

Also, the magnetostrictive material is preferably a rare earth-cobalt alloy, which is a super magnetostrictive alloy and whose axis of easy magnetization is substantially $<100>$ or $<110>$.

If the value for z, which denotes the ratio in atomic weight between the rare earth element and the transient metal, is more than 10, the material can hardly exhibit super magnetostriction of $10^{-4}$ or more. On the other hand, if the value of z is less than 0.2, effective substitution of iron cannot be observed. Preferably, $1.5 \leq z \leq 5$. If the value of x, which designates the amount of iron substituted, is less than 0.001, no effective substitution of iron is observed. On the other hand, if x is more than 0.8, iron (i.e., transient metal) contributes to magnetostriction too prominently, inevitably reducing the magnetostriction in inverse proportion to temperature. Preferably, $0.1 \leq x \leq 0.5$.

The component $(Co_{1-x} Fe_x)_z$ can be replaced by component $(Co_{1-x-y} Fe_x M_y)_z$, where M is Ni or Mn. The element M should be substituted in such an amount that the characteristics of the other elements be fully utilized. More precisely, y should be equal to or less than 0.5, namely $y \leq 0.5$.

The orientated film, either polycrystalline or single-crystal, can hardly be formed by means of ordinary sputtering (e.g., DC sputtering, magnetron sputtering, or the like), or by means of ordinary vapor deposition. The film should better be formed by molecule-beam epitaxy, CVD, MO-CVD, ion-beam sputtering, ECR plasma method, cluster ion-beam method, or the like. When an ion-beam method, using low-energy particles, is employed, a film having good crystallinity and, hence, good wave-propagation characteristic will be formed successfully.

The modulation magnetic-field generating section can be a coil or the like. This section is located near the magnetostrictive film, so that the modulation magnetic filed is effectively applied to the film. The characteristics of the magnetostrictive material, such as linearity, depends on the bias magnetic field applied to the film. Hence, the magnetoelastic wave device can comprise means for applying a bias magnetic field such that the modulation magnetic field is applied to the film at a desirable time. The means for applying the bias magnetic field can be either separated from, or incorporated in, the modulation magnetic-field generating section.

Both the magnetic field generating section and the wave receiving section have a interdigital transducer of the type commonly used in elastic wave devices.

Because of its specific structure described above, the magnetoelastic wave device according to the present invention can effectively propagate elastic waves and effectively apply a modulation magnetic field. The device has a propagation loss of only 10 dB or less and can change the sound speed by 10% attenuation or more, for elastic waves having a frequency falling within 100 MHz-band to GHz-band. In addition, such a great change in the sound speed can be achieved by applying a relatively low-intensity modulation magnetic field to the magnetostrictive film.

As can be understood from the above, the magnetoelastic wave device of the invention can change the sound speed by application of a low-intensity modulation magnetic field, which the conventional elastic wave devices cannot accomplish. The device of the invention can, therefore, be used as a tuner in any apparatus which requires a tuner, such as a tunable filter. Therefore, it can help to design a new electronic circuits for use in communication apparatuses, greatly contributing to the communication industry.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a partially cross-sectional view showing a magnetoelastic wave device according to a first embodiment of the present invention;

FIG. 1B is a diagram schematically showing the wave generating section and the wave receiving section, both incorporated in the device shown in FIG. 1A;

FIG. 2A is a cross-sectional view illustrating a magnetoelastic wave device according to a second embodiment of the present invention;

FIG. 2B is a diagram showing the meandering electrode used in the device shown in FIG. 2A;

FIG. 3A is a cross-sectional view showing a magnetoelastic wave device according to a third embodiment of the invention, which is characterized by thin-film components;

FIG. 3B is a cross-sectional view representing a magnetoelastic wave device according to a fourth embodiment of the invention, which is characterized by thin-film components and a soft magnetic film covering the peripheries of thin films;

DETAILED DESCRIPTION OF THE PREFERRED EMBODIMENTS

Figure 4A:
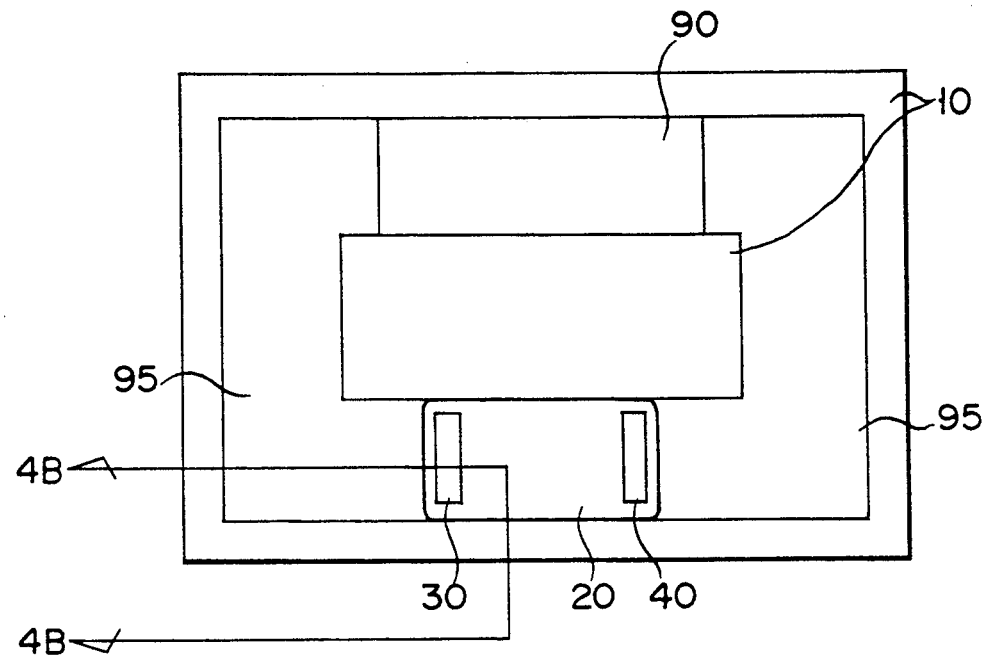
FIG. 4A is a plan view showing still a magnetoelastic wave device according to a fifth embodiment of the present invention.

Embodiments of the present invention will now be described, with reference to the accompanying drawings.

FIG. 1A shows a magnetoelastic wave device according to a first embodiment of the invention. As is illustrated in FIG. 1A, the magnetoelastic wave device comprises a substrate 10, a magnetostrictive film 20 formed on the substrate 10, a wave generating section 30 mounted on one end portion of the film 20, a wave receiving section 40 mounted on the other end portion of the film 20 and opposing the section 40, a modulation magnetic field generating section 50 surrounding the substrate 10, and a bias magnetic field generating section 60 near the both side of the substrate 10.

As is shown in FIG. 1B, the sections 40 and 30 can be each an interdigital transducer. The sections 50 and 60, which comprise a coil and a permanent magnet, respectively, can be dispensed with.

In operation, the wave generating section 30 excites the magnetostrictive film 20, whereby the film 20 generates surface waves. The wave receiving section 40 detects the surface waves and converts them into electric signals. The substrate 10 can be made of piezoelectric material or magnetostrictive material, and can therefore directly excite the surface waves generated by the magnetostrictive film 20. The bias magnetic field generating section 60 modulates the magnetostrictive film 20, thereby to determine the operating point of the magnetoelastic wave device. The modulation magnetic field generating section 50, which comprises a coil, can generate a bias magnetic field when a DC component is applied to it. Hence, bias magnetic field generating section 60 can be dispensed with.

The modulation magnetic field 52 generated by the section 50, the bias magnetic field 62 generated by the section 50 or 60, and the magnetoelastic waves generated by the film 20 may propagate in any direction. Nevertheless, it is desirable that all these waves propagate parallel to the magnetostrictive film 20.

FIG. 2A shows a magnetoelastic wave device according to a second embodiment of the invention. Most components of this device are identical to those of the device shown in FIG. 1A and, therefore, are designated at the same reference numerals in FIG. 2A and will not be described in detail. The device is characterized in two respects. First, as is shown in FIG. 2A, both the wave generating section 30 and the wave receiving section 40 are mounted on the magnetostrictive film 20, not on the substrate 10. Second, the sections 30 and 40 each comprise a meandering electrode of the type illustrated in FIG. 2B.

FIG. 3A shows a magnetoelastic wave device according to a third embodiment of the invention. As is shown in FIG. 3A, this device comprises a substrate 10, a bias magnetic field generating section 60 formed on the substrate 10, a first insulation film 70 formed on the section 60, a modulation magnetic field generating section 50 formed on the first insulation film 70, a second insulation film 70 formed on the section 70, a magnetostrictive film 20 formed on the second insulation film 70, a piezoelectric (magnetostrictive) film 25 formed on the film 20, a wave generating section 30 mounted on one end portion of the film 25, and a wave receiving section 40 mounted on the end portion of the film 25. As is evident from FIG. 3A, the section 50 and 60 are layers. The section 50 comprises a planar coil, and the section 60 comprises a planar electromagnetic coil.

The section 50 is electrically insulated from the section 60 by the first insulation film 70 and also from the magnetostrictive film 20 by the second insulation film 70. The magnetostrictive film 20 and the bias magnetic field generating section 60 can be made of insulative material. If they are electrically insulative, the insulation films 70 can be dispensed with.

As has been described, the piezoelectric (magnetostrictive) film 25 is formed on the magnetostrictive film 20, and surface waves are generated over the piezoelectric film 25. Instead, the wave generating section 30 can be mounted directly on the film 20, thereby to generate surface waves over the magnetostrictive film 20, just in the same way as is illustrated in FIG. 1A.

With the magnetoelastic wave device shown in FIG. 3A it is difficult to apply the magnetic field generated by the section 60 in a direction parallel to the surface of the magnetostrictive film 20. FIG. 3B shows a magnetoelastic wave device which is a fourth embodiment of the invention and which is designed such that the magnetic field of the section 60 extends parallel to the surface of the magnetostrictive film 20. More specifically, as is illustrated in FIG. 3B, a soft magnetic film 80 covers the peripheries of the film 20, the section 50 and the section 60, magnetically coupling the film 20 and the section 60. Hence, the magnetic field which the section 60 generates is applied parallel to the surface of the magnetostrictive film 20.

In the devices shown in FIGS. 3A and 3B, it is desirable that the modulation magnetic field generating section 50 comprise a meandering coil of the type shown in FIG. 2B, rather than a planar coil. If the section 50 comprises a planar coil, it generates a modulation magnetic field which extends at right angles to the surface of the magnetostrictive film 20. On the other hand, if the section 50 comprises a meandering coil, it generates a modulation magnetic field which extends parallel to the surface of the film 20.

In both the device of FIG. 3A and the device of FIG. 3B, the modulation magnetic field generating section 50 and the bias magnetic field generating section 60 are formed on the substrate 10 and are formed one upon another. According to the present invention, these sections 50 and 60 can be formed on the same plane, as is illustrated in FIGS. 4A and 4B.

Figure 4B:
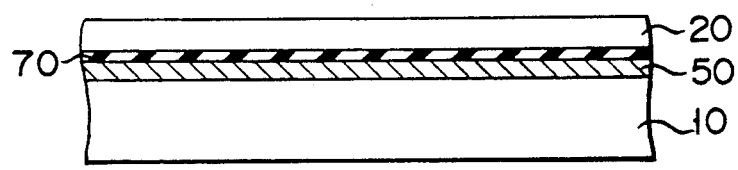
FIG. 4B is a sectional view showing the device of FIG. 4A, taken along line 4B—4B in FIG. 4A.

FIGS. 4A and 4B show a magnetoelastic wave device according to a fifth embodiment of the invention. As is shown in these figures, this device comprises a substrate 10, an insulation film 70 formed on the substrate 10, a magnetostrictive film 20 formed on a part of the film 70, a wave generating section 30 mounted on one end portion of the film 20, a wave receiving section 40 mounted on the other end portion of the film 20, a thin magnet 90 mounted on a part of the film 70 and opposing the magnetostrictive film 20, and two yokes 95 made of soft magnetic material such as amorphous-based alloy, formed on the insulation film 70 and opposing each other. Either yoke 95 electrically connects the film 20 and the thin magnet 90, so that the magnet 90 applies a bias magnetic field to the magnetostrictive film 20.

As is evident from FIG. 4B, a modulation magnetic field generating section 50 comprising a meandering coil of the type shown in FIG. 2B is located below the magnetostrictive film 20 and insulated therefrom by means of the insulation film 70. The insulation film 70 insulating the meandering coil from the film 20 need not be formed in the same way as in the embodiment shown in FIG. 3A.

Each embodiment of the invention, described above, can further comprise an absorber for absorbing excessive magnetoelastic waves, a member for preventing reflection of magnetoelastic waves, a backing plate for compensating temperature, a means for shielding external noise, and the like—all being of the types incorporated in the conventional magnetoelastic device such as a SAW filter.

The inventors have made a magnetoelastic wave device according to the invention. First, a mass of $Gd_{0.2}Dy_{0.8}(Fe_{0.2}Co_{0.8})_2$ was prepared and made into an alloy in a high-frequency vacuum furnace. The alloy, thus produced, was refined first in a plasma-arc furnace and then in a floating-band furnace. The refined alloy was used as material of a magnetostrictive film.

Then, a substrate was prepared. More precisely, an $<YZ>LiNbO_{3P}$ single crystal for propagating magnetoelastic waves in Z-axis direction was subjected to Y-axis cutting. The cut surface of the single crystal was polished, reducing the surface roughness to a few angstroms, and was then washed. As a result, an $LiNbO_3$ substrate having a smooth and clean surface was produced.

Thereafter, a high-crystallinity film, consisting of crystals orientated in $<100>$ plane, was formed on the substrate, by using the alloy in a molecule beam epitaxial-growth apparatus in which a vacuum is maintained at $10_{-11}$ Torr. The film, thus formed, had a thickness of 5000 angstroms, and was made up of small crystals having a diameter of tens of angstroms to hundreds of angstroms.

Two interdigital electrodes, one for an input electrode and the other for an output electrode, were formed on the substrate, thus manufacturing a magneto elastic wave device. The device was driven, and generated magnetoelastic waves at the frequency of 500 MHz. When a modulation magnetic field of a low intensity of about 10 Oe was applied to the magnetostrictive film (in the MHz band), the speed of sound was changed by 15% to about 400 m/sec. The attenuation was as small as 5 dB. The bias magnetic field applied was 500 Oe.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A magnetoelastic wave device comprising:
a substrate having first and second end portions;
a magnetostrictive film formed over said substrate and having an axis of easy magnetization which is substantially <100> axis or <110> axis and extends parallel to the major surfaces of said film;
a wave generating section mounted over the first end portion of said substrate, for generating a magnetoelastic wave;
a wave receiving section mounted over the second end portion of said substrate and opposing said wave generating section, with said magnetostrictive film located between said wave generating section and said wave receiving section; and
a modulation magnetic field generating section for generating a modulation magnetic field to be applied to said magnetostrictive film, further comprising:
an insulation film formed on said magnetostrictive oriented film; and
one of a piezoelectric film and a magnetostrictive film formed on said insulation film.

2. The device according to claim 1, wherein said wave generating section and said wave receiving section are located on one of said piezoelectric film and magnetostrictive film.

3. A magnetoelastic wave device comprising:
a substrate having first and second end portions;
a magnetostrictive film formed over said substrate and having an axis of easy magnetization which is substantially <100> axis or <110> axis and extends parallel to the major surfaces of said film;
a wave generating section mounted over the first end portion of said substrate, for generating a magnetoelastic wave;
a wave receiving section mounted over the second end portion of said substrate and opposing said wave generating section, with said magnetostrictive film located between said wave generating section and said wave receiving section; and
a modulation magnetic field generating section for generating a modulation magnetic field to be applied to said magnetostrictive film, wherein said magnetostrictive film is made of material identified by the following general formula:

$R(Co_{1-x}Fe_x)_z$ where $0.001 \leq x \leq 0.8$ $0.2 \leq z \leq 10$

R: at least one element selected from the group consisting of Y and a rare-earth element.

4. A magnetoelastic wave device comprising:
a substrate;
a modulation magnetic field generating section located over said substrate;
an insulation film formed on said modulation magnetic field generating section;
a magnetostrictive film formed on said insulation film;
a wave generating section located above said magnetostrictive film; and
a wave receiving section located above said magnetostrictive film and opposing said wave generating section.

5. The device according to claim 4, further comprising a bias magnetic field generating section for applying a bias magnetic field to said magnetostrictive film.

6. The device according to claim 5, further comprising a soft magnetic film covering the periphery of said bias magnetic field generating section, the periphery of said modulation magnetic generating section, the periphery of said insulation film and the periphery of said magnetostrictive film.

7. The device according to claim 4, further comprising:
a piezoelectric film mounted on said magnetostrictive film.

8. The device according to claim 7, wherein said piezoelectric film is made of magnetostrictive material.

9. A magnetoelastic wave device comprising:
a substrate having first and second end portions;
a magnetostrictive oriented film formed over said substrate, and having an axis of easy magnetization which is substantially <uv0> axis an extends parallel to the major surfaces of said magnetostrictive film, and made of material identified by the following general formula:

$R (Co_{1-x} Fe_x)_z$ where $0.001 \leq x \leq 0.8$ $0.2 \leq z \leq 10$

R: at least one element selected from the group consisting of Y, La, Ce, Pr, Nd, Sm, Gd, Dy, Er, Yb and Lu;
a wave generating section mounted on the first end portion of said substrate;
a wave receiving section mounted on the second end portion of said substrate and opposing said wave generating section, with said magnetostrictive film located between said wave generating section and said wave receiving section; and
a modulation magnetic field generating section for applying a modulation magnetic field to said magnetostrictive film.

10. A magnetoelastic wave device comprising:
a substrate having first and second end portions;
a magnetostrictive film which is made of a rare earth-iron-cobalt alloy, formed over said substrate, having an axis of easy magnetization which is substantially <100> axis or <110> axis and extends parallel to major surfaces of said magnetostrictive film;

a wave generating section mounted over the first end portion of said substrate, for generating a magnetoelastic wave;

a wave receiving section mounted over the second end portion of said substrate and opposing said wave generating section, with said magnetostrictive film being located between said wave generating section and said wave receiving section; and a modulation magnetic field generating section for generating a modulation magnetic field to be applied to said magnetostrictive film.

* * * * *